United States Patent [19]

Shigekane

[11] Patent Number: 5,349,230
[45] Date of Patent: Sep. 20, 1994

[54] DIODE CIRCUIT FOR HIGH SPEED SWITCHING TRANSISTOR

[75] Inventor: Hisao Shigekane, Kanagawa, Japan

[73] Assignee: Fuji Electric Co., Ltd., Kanagawa, Japan

[21] Appl. No.: 783,333

[22] Filed: Oct. 28, 1991

[30] Foreign Application Priority Data

Dec. 28, 1990 [JP] Japan .................. 2-408533

[51] Int. Cl.$^5$ .................. H01L 29/48; H01L 29/56; H01L 29/64; H03K 17/60
[52] U.S. Cl. .................. 257/474; 257/471; 257/478; 307/253; 307/318; 307/576
[58] Field of Search .................. 357/15, 75, 76, 81; 307/318, 576, 253, 318, 253, 576; 257/570, 577, 477, 471, 474, 478

[56] References Cited

U.S. PATENT DOCUMENTS

| | | | |
|---|---|---|---|
| 4,554,568 | 11/1985 | Champon et al. | 357/13 |
| 4,594,602 | 6/1986 | Iimura et al. | 357/13 |
| 4,694,313 | 9/1987 | Beasom | 357/23.4 |
| 4,811,065 | 3/1989 | Cogan | 357/23.4 |
| 4,941,030 | 7/1990 | Majumdar | 357/43 |
| 4,984,065 | 1/1991 | Sako | 357/81 |
| 5,057,906 | 10/1991 | Ishigami | 357/80 |
| 5,081,509 | 1/1992 | Kozaka et al. | 357/13 |
| 5,101,244 | 3/1992 | Mori et al. | 357/15 |

FOREIGN PATENT DOCUMENTS

| | | |
|---|---|---|
| 0379346A2 | 7/1990 | European Pat. Off. |
| 59-74728 | 4/1984 | Japan |
| 61-97862 | 5/1986 | Japan |

OTHER PUBLICATIONS

A.P. De Haas et al., "Pulsed Beam Measurement System," Nuclear Instruments & Methods in Physics Research, vol. B29, No. 1-2, Nov. 1987.

*Primary Examiner*—Jerome Jackson
*Assistant Examiner*—Valencia M. Wallace
*Attorney, Agent, or Firm*—Finnegan, Henderson, Farabow, Garrett & Dunner

[57] ABSTRACT

A semiconductor device, comprising a transistor, a constant voltage diode having a first end of a first conductivity type connected to an emitter of the transistor and a second end of a second conductivity type, a reverse current preventive diode having a first end of the first conductivity type connected to a collector of the transistor and a second end of the second conductivity type connected to the second end of the constant voltage diode, and a high speed diode reverse-bias connected between the transistor collector and the emitter of the transistor.

7 Claims, 3 Drawing Sheets

DIODE CIRCUIT FOR HIGH SPEED SWITCHING TRANSISTOR

BACKGROUND OF THE INVENTION

1. Field of the Invention

The present invention relates to a semiconductor device comprising a transistor, such as a power transistor or an insulated gate bipolar transistor (IGBT), for use as a high speed semiconductor power switch.

2. Discussion of the Related Art

Typically, when a transistor, such as a power transistor or an IGBT, is used as a high speed power switch, a diode, such as a free wheeling diode (FWD), is connected across the transistor's emitter and collector to provide a current path from the transistor's emitter to its collector. For example, as shown in FIG. 3, there is provided a transistor 1 having a high speed diode 2 reverse-bias connected between a collector 12 and emitter 11 of the transistor 1. As shown in FIG. 2, such a circuit arrangement has application in an inductive load circuit, wherein a plurality of power rectifiers 22 and transistor inverters 23 control the speed of a motor 21.

In the circuit arrangement shown in FIG. 3, it is often desirable that the high speed diode 2 not only provide a current path from the transistor's emitter to its collector, but also function as a constant voltage diode to protect the transistor 1 against voltage surges at the collector 12. Thus, it is often desirable that the high speed diode 2 have the characteristics of, for example, a Zener or avalanche diode, as exemplified by Zener diode 3 shown in the equivalent circuit of FIG. 4. It is known in the art that a reach-through Zener diode having a cross sectional structure shown in FIG. 5 may be used as the Zener diode 3 shown in the circuit of FIG. 4.

As shown in FIG. 5, the reach-through Zener diode comprises a cathode electrode 36, an $N^+$-type layer 32 formed on the cathode electrode 36, an $N^-$-type layer 31 formed on the $N^{30}$-type layer 32, a $P^+$-type layer 33 diffused in the $N^-$-type layer 31, an oxide film 34 formed on the $P^+$-type layer 33, and an anode electrode 35 formed on the $p^+$-type layer 33 through an opening in the oxide film 34. The Zener voltage of the reach-through Zener diode is determined by the specific resistance which is largely a function of the width W1 of the $N^-$-type layer 31. Because $t_{rr}$ of such a Zener diode is long, however, the diode will not have the desired characteristics of the high speed diode 2 shown in FIG. 3. Furthermore, if a lifetime Killer is used to control $t_{rr}$ of the Zener diode to shorten $t_{rr}$, the Zener voltage will not be stable. Where, $t_{rr}$ indicates a time in which a reverse current flowing a diode when a voltage applied to the diode is changed from a fixed forward voltage to a fixed reverse voltage, recovers to 10% of the maximum value.

SUMMARY OF THE INVENTION

Accordingly, it is an object of the present invention provide a semiconductor device comprising a transistor and a diode arrangement, wherein the diode arrangement functions as a bypass circuit capable of high speed switching across the transistor's emitter and collector and as a voltage regulator circuit for protecting the transistor from irregular voltages applied to its collector.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

To achieve the foregoing object, and in accordance with the purposes of the invention as embodied and broadly described herein, a semiconductor device is provided comprising a transistor, a constant voltage diode having a first end of a first conductivity type connected to an emitter of the transistor and a second end of a second condutivity type, a reverse current preventive diode having a first end of the first conductivity type connected to a collector of the transistor and a second end of the second conductivity type connected to the second end of the constant voltage diode, and a high speed diode reverse-bias connected between the collector of the transistor and an emitter of the transistor.

In a first embodiment, the constant voltage diode comprises a Zener diode chip including an N-type layer and a P-type layer, and the reverse current preventive diode comprises a diode chip including an N-type layer and a P-type layer, the constant voltage diode chip and the Zener diode chip being connected by brazing.

In a second embodiment, the semiconductor further comprises a cooling plate, an insulating plate disposed on the cooling plate, an emitter electrode plate disposed on the insulating plate and connected between the emitter and the first end of the constant voltage diode, and a collector electrode plate disposed on the insulating plate and connected between the collector, the high speed diode, and the first end of the reverse current preventive diode.

In a third embodiment, the constant voltage diode and the reverse current preventive diode comprise a single diode device, the single diode device including a Schottky barrier electrode, an $N^-$-type layer formed on the Schottky barrier electrode, a $P^+$-type layer diffused into the $N^-$-type layer, an oxide film formed on the $P^+$-type layer, the oxide film having an opening, and an anode electrode formed on the $P^+$-type layer through the opening in the oxide film.

In a fourth embodiment, the constant voltage diode and said reverse current preventive diode comprise a single diode device, the single diode device including, a Schottky barrier electrode, a $P^-$-type layer formed on the Schottky barrier electrode, an $N^+$-type layer diffused into the $P^-$-type layer, an oxide film formed on the $N^+$-type layer, and a cathode electrode formed on the $N^+$-type layer through an opening in the oxide film.

In a fifth embodiment, a semiconductor device is provided comprising a transistor including a first layer having a first conductivity, a second layer diffused in the first layer and having a second conductivity, and a third layer diffused in the second layer and having the first conductivity, a high speed diode including a fourth layer diffused in the first layer and having the second conductivity, and a lifetime killer for controlling carrier rebinding within the high speed diode, a constant voltage diode including a fifth layer diffused in the first layer and having the second conductivity, and a preventive diode including a Schottky barrier electrode formed on the first layer.

The present invention provides a high speed diode, for example, an FWD, connected in parallel with a constant voltage diode between a transistor's emitter and collector to ensure that the high speed switching property of the FWD and the stable constant voltage characteristics of the constant voltage diode are made compatible. The present invention also provides a reverse current preventive diode connected reversely in series with the constant voltage diode to allow a reverse voltage to be applied to the constant voltage diode and to prevent a forward current from flowing therethrough.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention. In the drawings.

DESCRIPTION OF THE PREFERRED EMBODIMENTS

Figure 1:
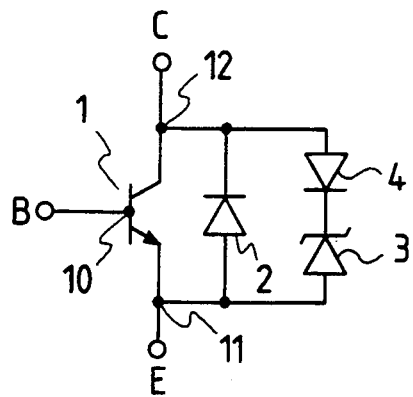
FIG. 1 illustrates an equivalent circuit of the present invention.
Figure 2:
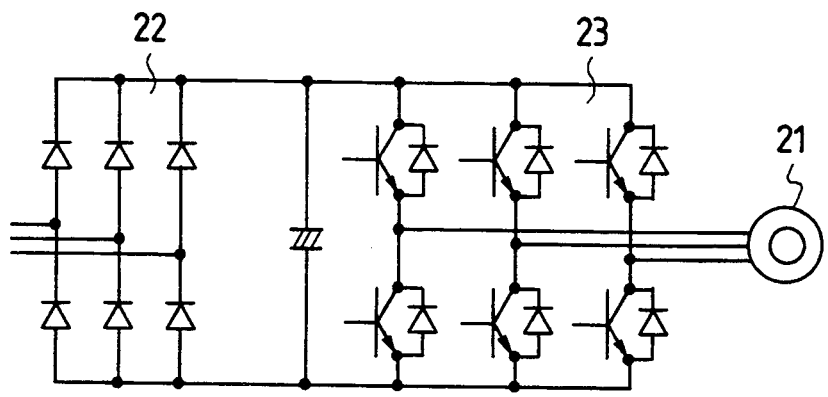
FIG. 2 illustrates a motor speed control circuit with which the teachings of the present invention can be incorporated.
Figure 3:
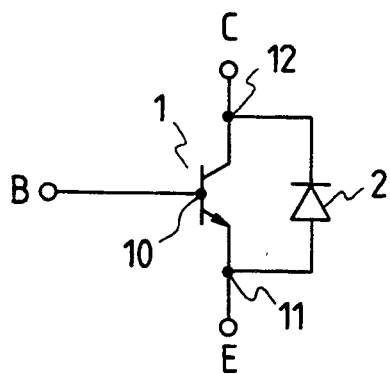
FIG. 3 illustrates an equivalent circuit of a high speed diode and transistor.
Figure 4:
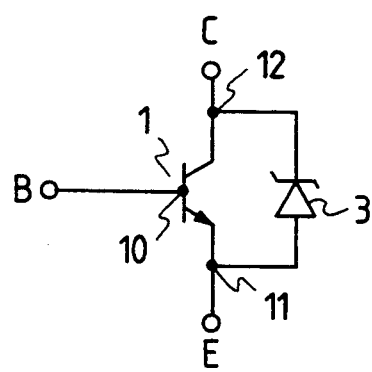
FIG. 4 illustrates an equivalent circuit of a Zener diode and a transistor.
Figure 5:
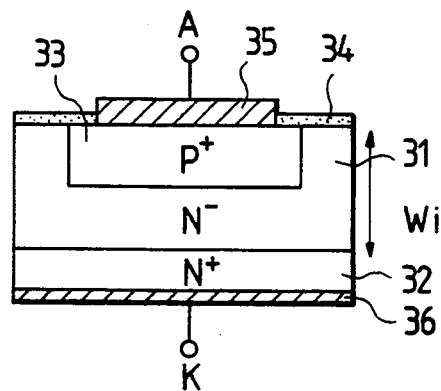
FIG. 5 illustrates a cross-sectional view of the Zener diode of FIG. 4.

Reference will now be made in detail to the presently preferred embodiments of the invention as illustrated in the accompanying drawings, in which like reference characters designate like or corresponding parts throughout the several drawings.

As illustrated in FIG. 1, there is provided a transistor 1 having a base 10, an emitter 11, and a collector 12, a high speed diode 2, a constant voltage diode 3, and a reverse current preventive diode 4. As also shown in FIG. 1, the high speed diode 2 is reverse-bias connected between the emitter 11 and collector 12, and the constant voltage diode 3 and reverse current preventive diode 4 are connected in series between emitter 11 and collector 12 such that the anode of the high speed diode 2 is connected to the emitter 11, the cathode of the constant voltage diode 3 is connected to the cathode of the reverse current preventive diode 4, and the anode of the reverse current preventive diode 4 is connected to the collector 12.

Figure 6:
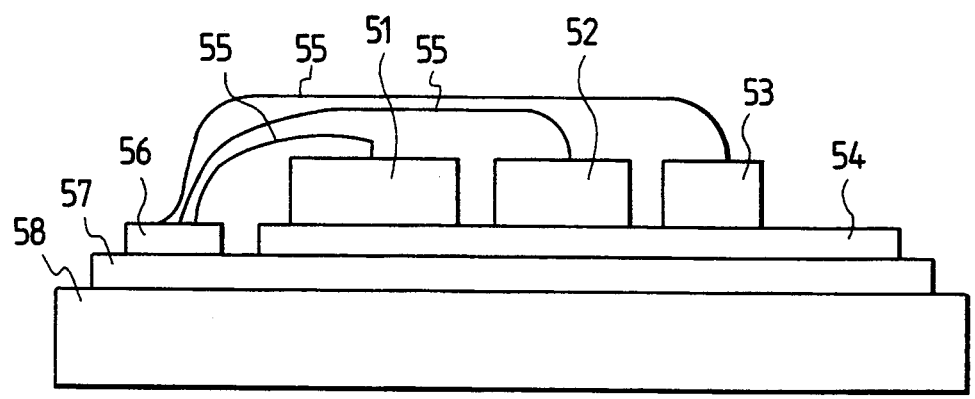
FIG. 6 illustrates a modular elevational view of a first embodiment of the present invention.

As shown in FIG. 6, in a first embodiment, the circuit shown in FIG. 1 comprises a transistor 51, a discrete high speed diode chip 52, and a diode device 53 including a series connected constant voltage diode and reverse current preventive diode, a collector electrode plate 54, conductors 55, an emitter electrode plate 56, an insulating plate 57, and a cooling plate 58. The lower terminals of the high speed diode 52 and diode device 53 are secured to the collector electrode plate 54, as is the collector of the transistor 51. The upper terminals of the high speed diode 52 and diode device 53 and the emitter of the transistor 51 are connected to the emitter electrode plate 56 via the conductors 55. The collector electrode plate 54 and the emitter electrode plate 56 are secured to the insulating plate 57 which is, in turn, secured to the cooling plate 58.

Figure 7:
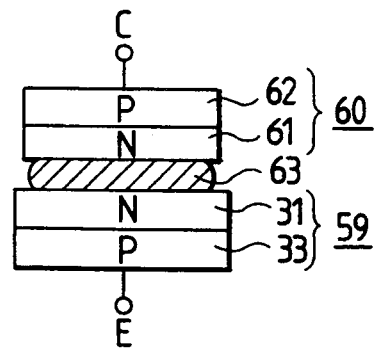
FIG. 7 illustrates a cross-sectional view of a second embodiment of the present invention.

As shown in FIG. 7, in a second embodiment, the constant voltage diode 3 of FIG. 1 comprises a Zener diode chip 59 including an N-type layer 31 and a P-type layer 33, and the reverse current preventive diode 4 of FIG. 1 comprises a diode chip 60 including an N-type layer 61 and a P-type layer 62. Preferably, the diode chip 60 comprises a fast recovery diode (FRD) having a short reverse recovery time. The Zener diode chip 59 and the diode chip 60 are joined by, for example, brazing with a layer of solder 63.

Figure 8A:
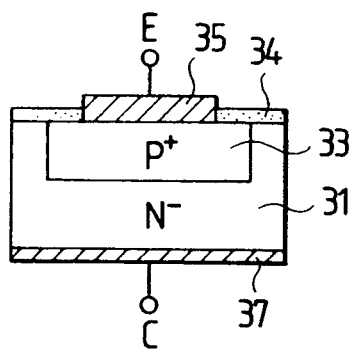
FIG. 8(a) illustrates a cross-sectional view of a third embodiment of the present invention.
Figure 8B:
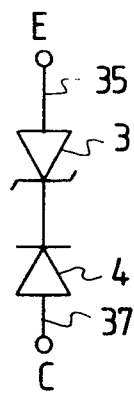
FIG. 8(b) illustrates an equivalent circuit diagram of the third embodiment of the present invention.

As shown in FIGS. 8 (a)–8 (b), in a third embodiment, the constant voltage diode 3 and the reverse current preventive diode 4 of FIG. 1 comprise a single device. As shown in FIG. 8(a), the device includes a Schottky barrier electrode 37, an N$^-$-type layer 31 formed on the Schottky barrier electrode 37, a P$^+$-type layer 33 diffused into the N$^-$-type layer 31, an oxide film 34 formed on the P$^+$-type layer 33, and an anode electrode 35 formed on the P+-type layer 33 through an opening in the oxide film 34. The P$^+$-type layer 33 is formed, for example, by a selective diffusion process, and the Schottky barrier electrode 37 comprises, for example, Cr or Al. As should be apparent from FIGS. 8(a)–8(b), the constant voltage diode 3 of FIG. 1 is constituted by the N$^-$-type layer 31 and the P$^+$-type layer 33, and the reverse current preventive diode 4 of FIG. 1 is constituted by the N$^-$-type layer 31 and the Schottky barrier electrode 37. The pressure resistance of the Schottky barrier electrode 37 is sufficient because the pressure resistance of the reverse current preventive diode 4 only needs to correspond to the voltage drop in the forward direction of the constant voltage diode 3. As shown in FIGS. 8(a)–8(b), the anode electrode 35 is connected to the emitter 11 of the transistor 1 of FIG. 1, and the Schottky barrier electrode 37 is connected to the collector 12 of the transistor 1 of FIG. 1.

Figure 9A:
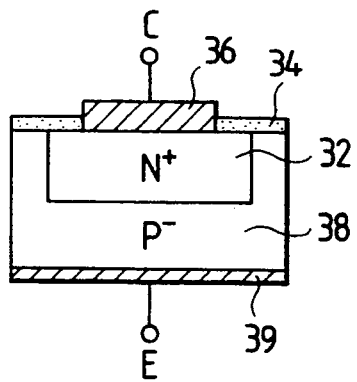
FIG. 9(a) illustrates a cross-sectional view of a forth embodiment of the present invention.
Figure 9B:
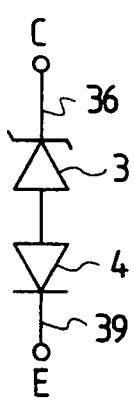
FIG. 9(b) illustrates an equivalent circuit diagram of the fourth embodiment of the present invention.

As shown in FIGS. 9(a)–9(b), in a fourth embodiment, the constant voltage diode 3 and the reverse current preventive diode 4 of FIG. 1 comprise a single device as in the third embodiment. As shown in FIG. 9(a), the device includes a Schottky barrier electrode 39, a P$^-$-type layer 38 formed on the Schottky barrier electrode 39, an N$^+$-type layer 31 diffused into the P$^-$-type .Layer 38, an oxide film 34 formed on the N$^+$-type layer 32, and a cathode electrode 34 formed on the N$^+$-type layer 32 through an opening in the oxide film 34. The N$^+$-type layer 33 is formed, for example, by a selective diffusion process, and the Schottky barrier electrode 37 comprises, for example, Cr or Al. As should be apparent from FIGS. 9(a)–9(b), the constant voltage diode 3 of FIG. 1 is constituted by the N$^+$-type layer 32 and the P$^-$-type layer 38, and the reverse current preventive diode 4 of FIG. 1 is constituted by the P$^-$-type layer 38 and the Schottky barrier electrode 39. As also shown in FIGS. 9 (a)–9(b), the cathode electrode 36 is connected to the collector 12 of the transistor 1 of FIG. 1, and the Schottky barrier electrode 39 is connected to the emitter 11 of the transistor 1 of FIG. 1. A constant voltage diode 3 requiring a Zener voltage of 500 V or higher, makes the structure of this embodiment unsuitable and, therefore, it is preferred to make the N− layer 31 a base, as shown in FIGS. 8(a)-8(b).

Figure 10:
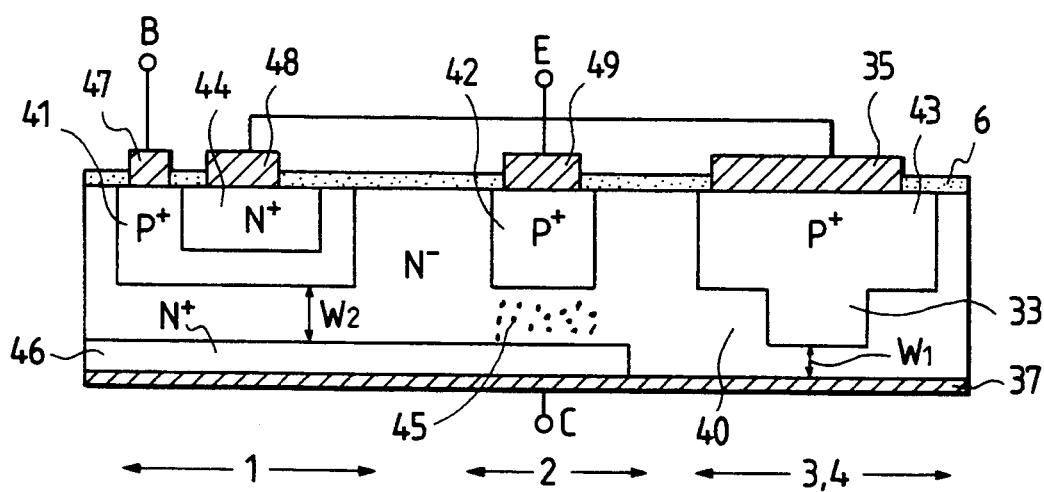
FIG. 10 illustrates a cross-sectional view of a fifth embodiment of the present invention.

As shown in FIG. 10, in a fifth embodiment, the transistor 1, high speed diode 2, constant voltage diode 3, and reverse current preventive diode 4 are all integrated into a single device. As shown in the figure, the transistor 1 includes a P+-type layer 41 as its base, an N+-type layer 44 as its emitter, and an N−-type layer 40 as its collector. The P+-type layer 41, P+-type layer 42, and the P+-type layer 43 are formed, for example, as a result of first selective diffusion using an oxide film mask. The transistor 1 also includes a base electrode 47 connected to the P+-type layer 41, an emitter electrode 48 connected to the N+-type layer 44, and a metallic layer 37, as a collector electrode, connected to the N−-type layer 40 via an N+-type layer 46.

The high speed diode 2 includes the P+-type layer 42 as its anode and the N−-type layer 40 as its cathode. Further, a lifetime killer 45 comprising, for example, gold can be introduced into the N−-type layer 40 beneath the P+-type layer 42 by, for instance, selective diffusion, to promote carrier rebinding, thereby increasing the operating speed of the high speed diode 2. The high speed diode 2 is also provided with an anode electrode 49 connected to the P+-type layer 42 and to the emitter electrode 48 of the transistor 1.

The constant voltage diode 3 and the reverse current preventive diode 4 include a P+-type layer 43 diffused into the N+-type layer 40, a well P+-type layer 33 formed by rediffusing impurities in part of the P+-type layer 43, and the metallic layer 37. Although not shown in the figure, the well P+-type layer 33 and the P+-type layer 43 can have the same area. The constant voltage diode 3 is constituted by the well P+-type layer 33 and the N−-type layer 40, and the reverse current preventive diode 4 is constituted by a Schottky diode including the N−-type layer 40 and the metallic layer 37 as a Schottky barrier electrode. Thus, the structure of the constant voltage diode 3 and the reverse current preventive diode 4 of FIG. 10 is similar to the structure shown in FIGS. 8(a)-8(b). The constant voltage diode 3 and the reverse current preventive diode 4 are also provided with an anode electrode 35 which is connected to the well P+-type layer 33, the emitter electrode 48 of the transistor 1, and the anode electrode 49.

As shown in FIG. 10, the metallic layer 37 contacts the N−-type layer 40 of the transistor 1 and the high speed diode 2 via the N+-type layer 46 and, therefore, simultaneously acts as the collector electrode of the transistor 1 and the cathode of the high speed diode 2. Moreover, the base electrode 47 of the transistor 1 contacts the P+-type layer 41, the emitter electrode 48 contacts the N+-type layer 44, the anode electrode 49 of the high speed diode 2 contacts the P+-type layer 42, and the anode electrode 35 of the constant voltage diode 3 contacts the P+-type layer 43. Because the electrodes 48, 49, and 35 are mutually connected, the equivalent circuit shown in FIG. 1 is thus arranged. In this structure, the width W1 of the N−-type layer 40 between the well P+-type layer 33 and the metallic layer 37 is approximately 35 μm, provided the Zener voltage of the constant voltage diode 3 is, for example, 400 V. Further, the width W2 of the N−-type layer 40 underneath the P+-type layer 41 and the P+-type layer 42 is approximately 60 μm.

Although the transistor 1 shown in FIG. 10 is an ordinary bipolar transistor, the transistor 1 can also be, for example, an IGBT by forming a P+-type source layer on the surface of the N+-type layer 44 and providing an MOS structure thereon. In addition, the conductive type of the transistor 1 may be reversed.

According to the present invention, a transistor is provided with a diode arrangement including a high speed diode which functions as a bypass circuit capable of high speed switching across the transistor's emitter and collector, and as a constant voltage diode and reverse current preventive diode for protecting the transistor from irregular voltages applied to its collector. Moreover, the constant voltage diode and the reverse current preventive diode can be integrated into a single device, thereby simplifying the circuit arrangement of the present invention. Further, the transistor and high speed diode, as well as the constant voltage diode and the reverse current preventive diode, can be integrated into a single device, thereby further simplifying the circuit arrangement of the present invention.

Additional advantages and modifications will readily occur to those skilled in the art. Therefore, the invention in its broader aspects is not limited to the specific details, representative devices, and illustrative examples shown and described. Accordingly, departures may be made from such details without departing from the spirit or scope of the general inventive concept as defined by the appended claims and their equivalents.

What is claimed is:

1. A high speed switching transistor circuit, comprising:

a transistor;

a constant voltage diode having a first end of a first conductivity type connected to an emitter of said transistor and a second end of a second conductivity type;

a reverse current preventive diode having a first end of said first conductivity type connected to a collector of said transistor and a second end of said second conductivity type connected to said second end of said constant voltage diode;

a high speed diode reverse-bias connected between said transistor collector and said transistor emitter;

a cooling plate;

an insulating plate disposed on said cooling plate;

an emitter electrode plate disposed on said insulating plate and connected between said transistor emitter and said first end of said constant voltage diode; and a collector electrode plate disposed on said insulating plate and connected between said transistor collector, said high speed diode, and said first end of said reverse current preventive diode, wherein said transistor, constant voltage diode, reverse current presentation diode and high speed diode are disposed on said collector electrode plate.

2. A high speed switching transistor circuit, comprising:

a transistor;

a constant voltage diode having a first end of a first conductivity type connected to an emitter of said transistor and a second end of a second conductivity type;

a reverse current preventive diode having a first end of said first conductivity type connected to a collector of said transistor and a second end of said second conductivity type connected to said second end of said constant voltage diode; and a high speed diode reverse-bias connected between said transistor collector and said transistor emitter, wherein said constant voltage diode comprises a Zener diode chip including an N-type layer and a P-type layer, and wherein said reverse current preventive diode comprises a diode chip including an N-type layer and a P-type layer, said constant voltage diode chip and said Zener diode chip being connected by brazing.

3. A high speed switching transistor circuit, comprising:

a transistor;

a constant voltage diode having a first end of a first conductivity type connected to an emitter of said transistor and a second end of a second conductivity type;

a reverse current preventive diode having a first end of said first conductivity type connected to a collector of said transistor and a second end of said second conductivity type connected to said second end of said constant voltage diode; and a high speed diode reverse-bias connected between said transistor collector and said transistor emitter, wherein said constant voltage diode and said reverse current preventive diode comprise a single diode device, said single diode device including a Schottky barrier electrode, an $N^-$-type layer formed on said Schottky barrier electrode, a $P^+$-type layer diffused into said $N^-$-type layer, an oxide film formed on said $P^+$-type layer, said oxide film having an opening, and an anode electrode formed on said $P^+$-type layer through said opening in said oxide film.

4. A high speed switching transistor circuit, comprising:

a transistor;

a constant voltage diode having a first end of a first conductivity type connected to an emitter of said transistor and a second end of a second conductivity type;

a reverse current preventive diode having a first end of said first conductivity type connected to a collector of said transistor and a second end of said second conductivity type connected to said second end of said constant voltage diode; and a high speed diode reverse-bias connected between said transistor collector and said transistor emitter, wherein said constant voltage diode and said reverse current preventive diode comprise a single diode device, said single diode device including, a Schottky barrier electrode, a $P^-$-type layer formed on said Schottky barrier electrode, an $N^+$-type layer diffused into said $P^-$-type layer, an oxide film formed on said $N^+$-type layer, said oxide film having an opening, and a cathode electrode formed on said $N^+$-type layer through said opening in said oxide film.

5. A high speed switching transistor circuit, comprising: a transistor;

a constant voltage diode having a first end of a first conductivity type connected to an emitter of said transistor and a second end of a second conductivity type;

a reverse current preventive diode having a first end of said first conductivity type connected to a collector of said transistor and a second end of said second conductivity type connected to said second end of said constant voltage diode; and a high speed diode reverse-bias connected between said transistor collector and said transistor emitter, wherein said transistor includes a first region being of said second conductivity type, a second region diffused in said first region and being of said first conductivity type, and a third region diffused in said second region and being of said second conductivity type, wherein said high speed diode includes a fourth region diffused in said first region and being of said first conductivity type, and a lifetime killer for controlling carrier rebinding within said high speed diode, wherein said constant voltage diode includes a fifth region diffused in said first region and being of said first conductivity type, and wherein said reverse current preventive diode includes a Schottky barrier electrode formed on said first region.

6. The high speed switching transistor circuit of claim 5, wherein said Schottky barrier electrode forms a collector electrode of said transistor and a cathode electrode of said high speed diode.

7. The high speed switching transistor circuit of claim 5, wherein said lifetime killer comprises gold.

* * * * *